(12) United States Patent
Baeg

(10) Patent No.: US 8,664,971 B2
(45) Date of Patent: Mar. 4, 2014

(54) METHOD OF TESTING FUNCTIONING OF A SEMICONDUCTOR DEVICE

(75) Inventor: Sang Hyeon Baeg, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 318 days.

(21) Appl. No.: 13/129,477

(22) PCT Filed: Nov. 17, 2008

(86) PCT No.: PCT/KR2008/006757
§ 371 (c)(1),
(2), (4) Date: May 16, 2011

(87) PCT Pub. No.: WO2010/055964
PCT Pub. Date: May 20, 2010

(65) Prior Publication Data
US 2011/0227600 A1     Sep. 22, 2011

(51) Int. Cl.
*G01R 31/02*     (2006.01)
(52) U.S. Cl.
USPC ................................. 324/762.01; 324/762.02
(58) Field of Classification Search
None
See application file for complete search history.

(56) References Cited

U.S. PATENT DOCUMENTS 5,887,001 A * 3/1999 Russell .......................... 714/726
7,197,417 B2 * 3/2007 Pramanick et al. ........... 702/119
7,994,803 B2 * 8/2011 Miller ....................... 324/750.01

FOREIGN PATENT DOCUMENTS

JP    2007-263575 A    10/2007
JP    2008-164364 A    7/2008
KR    10-2006-0013828 A    2/2006

OTHER PUBLICATIONS

International Search Report from PCT/KR2008/006757 dated Jan. 29, 2009 (2 pages).
Written Opinion from PCT/KR2008/006757 dated Jan. 29, 2009 (3 pages).
Patent Abstracts of Japan Publication No. 2007-263575 date Oct. 11, 2007 (1 page).
Patent Abstracts of Japan Publication No. 2008-164364 dated Jul. 17, 2008 (1 page).
Korean Patent Abstracts Publication No. 10-2006-0013828 A dated Feb. 14, 2006 (2 pages).

* cited by examiner

*Primary Examiner* — Vinh Nguyen
(74) *Attorney, Agent, or Firm* — Flynn, Thiel, Boutell & Tanis, P.C.

(57) ABSTRACT

A method of testing a semiconductor device including applying a reference test pattern to the semiconductor device in which a preset number of power pins of the semiconductor device are supplied with current, incrementally disconnecting the power pins from the current to set a number of removal power pins, and determining a final number of power pins which represents a minimum number of power pins with which the semiconductor device operates normally. The method additionally includes applying a delay test pattern to the semiconductor device to set a cycle of the delay test pattern corresponding to the number of removal power pins to reduce or prevent an overkill phenomenon.

6 Claims, 2 Drawing Sheets

METHOD OF TESTING FUNCTIONING OF A SEMICONDUCTOR DEVICE

TECHNICAL FIELD

The present invention relates to a method of testing a semiconductor device, and more particularly, to a method of testing a semiconductor device capable of preventing electrical power from being supplied to a power pin in a chip, and setting an optimal test condition.

BACKGROUND ART

A process of testing a semiconductor device is performed after semiconductor chip fabrication and packaging processes. That is, whether a device that is formed after circuits and interconnections are implemented on a wafer fulfills its function is verified through the test process. Generally, a process that is performed at a wafer level before the packaging process is performed is referred to as Electrical Die Sorting (EDS). In addition, whether the device is good or not is also tested after packaging is performed.

As a design rule is reduced and complicated functions are realized in a single chip in the process of fabricating a semiconductor device, the test is performed after implementing a scan cell in a predetermined region of the chip rather than directly testing characteristic functions of the chip. The scan cell is disposed between a core or function block that takes charge of the characteristic functions of the device and input/output pads.

Generally, the scan cells are serially connected to each other to form a scan chain. The scan chain includes a shift register therein to continuously transmit a test pattern. The test pattern is applied to an input pin during the test, an output of an output pin is compared with an expected value, and finally, whether the device is defective or not is determined.

When the scan design-based test (scan test) is performed, overkill and underkill should be taken into account.

A case in which a good semiconductor device is determined to be defective is referred to as overkill, and a case when a substantially defective semiconductor device is determined to be good is referred to as underkill. Overkill and underkill are different from each other simply in view of the aspect of determination, however both are representative phenomena of a test being erroneously determined.

Generally, a switching operation of a circuit provided in the scan cell causes overkill. That is, when the number of switching operations of a circuit that is tested according to a test pattern exceeds the normal operation, an electric current supplied to the scan cell is increased. When an electric current supplied during the test is greater than that supplied during the normal operation of the semiconductor chip, a ground level is not uniformly set, and pulsating ground bouncing is generated. As a result, overkill in which a semiconductor chip operating normally in a packaged environment is determined to be defective during a test operation occurs.

In order to prevent the overkill phenomenon, a method of reducing a conventional test operating speed is used in automatic testing equipment. That is, a method of reducing the operating speed of the test pattern is used to lower transition of signals. Accordingly, the number of switching operations of a circuit in the scan cell per unit time is reduced, and thus the supplied electric current is reduced as well. The reduced electric current may minimize ground bouncing. However, the operating speed of the test pattern may not sufficiently cover the operating speed in a normal use environment.

Accordingly, underkill in which a defective semiconductor device in an actual package environment is determined to be good occurs.

DISCLOSURE OF INVENTION

Technical Problem

The present invention is directed to a method of testing a semiconductor device capable of determining an optimal number of power pins, and determining a clock cycle of a test pattern suitable for the selected number of power pins.

Technical Solution

One aspect of the present invention provides a method of testing a semiconductor device including: applying a reference test pattern to a semiconductor device, setting the number of removal power pins during a normal operation, and determining the final number of power pins; and applying a delay test pattern to the semiconductor device to set a cycle of the delay test pattern corresponding to the number of removal power pins.

Advantageous Effects

According to the present invention, a reference test pattern is applied to a semiconductor device to recognize a minimum number of power pins that are connectable when the subsequent test is performed. As a result, the most severe environment that the semiconductor device can stand during a normal operation is prepared. Afterwards, current is supplied to the semiconductor device according to the determined number of power pins, and a delay test pattern is applied. When the delay test pattern is applied, a cycle of the applied test pattern is increased as well in order to prevent an overkill phenomenon. Accordingly, ground bouncing according to the number of power pins is alleviated, so that the optimal delay test pattern can be set. As a result, a normally operating environment can be provided to the semiconductor device on which the test is performed, and a function test that is an actual operation of the semiconductor device can be fulfilled by a scan test.

MODE FOR THE INVENTION

Figure 1:
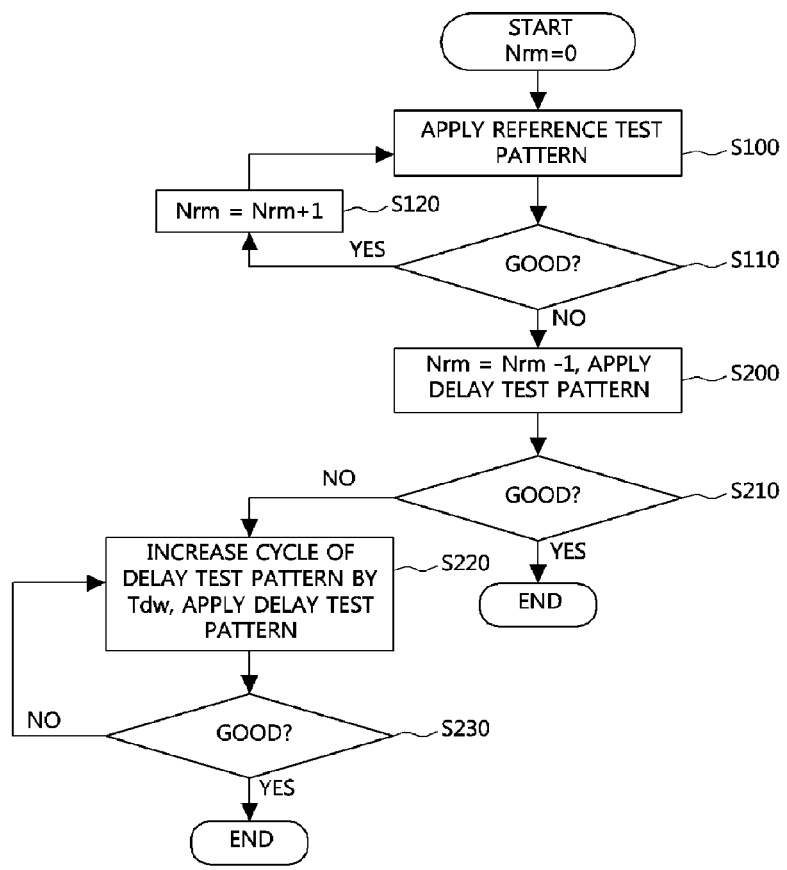
FIG. 1 is a flowchart illustrating a method of testing a semiconductor device according to an example embodiment of the present invention.

While the invention is applicable to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The presently described embodiments will be best understood by reference to the drawings, wherein like parts are designated by like numerals throughout.

Unless otherwise defined, all terms including technical and scientific terms used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Example embodiments of the present invention will be described in detail with reference to the accompanying drawings.

<Example Embodiment>

FIG. 1 is a flowchart illustrating a method of testing a semiconductor device according to an example embodiment of the present invention.

Referring to FIG. 1, a reference test pattern is applied to a semiconductor device (S100). The reference test pattern may be a function test pattern that tests characteristic functions of the semiconductor device. Therefore, the reference test pattern may be a test pattern for determining whether function blocks of the semiconductor device performing the characteristic functions operate or not. While the function test pattern is applied, the function test pattern is applied to the function blocks of the semiconductor device. Also, the function blocks perform a switching operation according to the function test pattern.

The above-described reference test pattern may be a test pattern other than the function test pattern. That is, any pattern that may cause the number of switching operations the same as or similar to the function test pattern may be used. In addition, when the function test pattern is applied to the semiconductor device on which the test is performed, the pattern is applied to the function blocks of the device, and switching may be generated. However, the switching may be generated in a scan cell provided in the semiconductor device. That is, when a predetermined pattern is applied to the scan cells and the number of switching operations is the same as or similar to the function test pattern, the pattern may be employed. Furthermore, setting the reference test pattern to be different according to the type of a semiconductor device will be obvious to one of ordinary skill in the art.

First, before applying the reference test pattern to the semiconductor device, the number of removal power pins Nrm is set to 0. Moreover, increase time of a delay test pattern cycle is set to 0 as well. The test pattern is applied from test equipment or is synchronized with a clock generated in a semiconductor device to be applied. Therefore, the cycle of the delay test pattern may be construed as being substantially the same as the clock cycle.

First, when a reference test pattern is initially applied to the semiconductor device, electrical power is supplied to every power pin in the semiconductor device. The power pin may be any kind of power pin, i.e., a power pin that supplies a positive supply voltage (referred to as Vdd among those skilled in the art), a power pin that supplies a negative supply voltage (referred to as Vss), or a power pin that supplies a ground voltage. In addition, the power pin may be construed as a power pad formed on a semiconductor device chip.

After the reference test pattern is applied, it is determined whether the semiconductor device on which the test is performed is good or not (S110).

When it is determined that the device is good, the number of removal power pins Nrm is increased by one (1) (S120). When it is determined that the device is good in the initial application of the reference test pattern, it is observed that the tested semiconductor device is substantially a good product.

In addition, when the semiconductor device determined to be defective in the initial application of the reference test pattern is finally determined to be defective, no more tests are performed on the device.

Increasing the number of removal power pins Nrm according to the determination that the device is good and application of the reference test pattern are continuously performed until the semiconductor device is determined to be defective according to the reference test pattern.

Accordingly, the above-described operation includes applying the reference test pattern to the semiconductor device until an initial defect is generated, and the number of removal power pins Nrm is increased by one (1) whenever the device is determined to be good. That is, whenever it is determined to be good by the reference test pattern, a test pin of a semiconductor device is interrupted from electrical power. The meaning of the operation is specified by FIG. 2.

Figure 2:
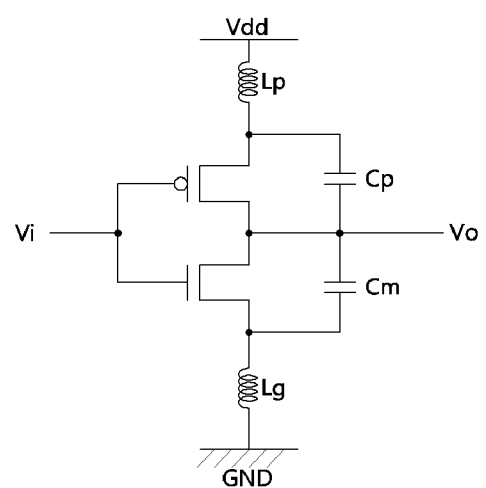
FIG. 2 is a circuit diagram illustrating operations for removing a power pin according to an example embodiment of the present invention.

FIG. 2 is a circuit diagram illustrating operations for removing a power pin according to an example embodiment of the present invention.

Referring to FIG. 2, a semiconductor device on which a test is performed includes a PMOS transistor and an NMOS transistor. The circuit diagram of FIG. 2 is an equivalent circuit which models an inverter to which the PMOS transistor and the NMOS transistor are connected. Also, the circuit diagram of FIG. 2 partially illustrates a switching device included in a semiconductor device, and it includes both a switching device of a function block and a switching device of a scan cell.

The NMOS transistor and the PMOS transistor illustrated in FIG. 2 are transistors having ideal characteristics. Also, every terminal of the actual PMOS transistor has inductance and capacitance ingredients. The transistor is illustrated as a model suitable for representing a change in current amount according to a switching operation. Therefore, the inductance ingredients Lp and Lg are formed between a positive supply voltage Vdd and a ground level GND, and the capacitance ingredients Cp and Cm exist between source and drain terminals of the transistor.

When the switching device is connected to a plurality of power pins, the connected portion between the switching device and the power pins is modeled as a structure in which a plurality of inductors are disposed in parallel. Also, as disclosed in the example embodiment, when the number of removal power pins Nrm is increased until a defect occurs in the semiconductor device, the inductance Lp or Lg seen from the transistors may be increased. The increased inductance Lp or Lg results in an increased voltage that is applied to the inductance Lp or Lg during the switching operation.

For example, the inductance Lg seen from a source terminal of the NMOS transistor having ideal characteristics in FIG. 2 is increased as the number of removal power pins Nrm is increased. This is because a voltage applied to the inductor is proportional to inductance and is also proportional to a change in current amount. Therefore, it is observed that the voltage applied to the source terminal of the NMOS transistor is increased during the switching operation, and the voltage is pulsating according to a change in current amount. This shows that ground bouncing is increased during the switching operation.

As a result, the above-described process includes applying the reference test pattern to the semiconductor device, and increasing the number of removal power pins Nrm until the semiconductor device is determined to be defective, so that a ground bouncing phenomenon according to the switching operation of a scan cell is increased. The above process is performed in order to set the same severe condition as when the semiconductor device normally starts the operation.

That is, increasing the number of removal power pins Nrm corresponds to an operation that increases ground bouncing of the semiconductor device, and recognizes the minimum number of connection power pins capable of maintaining the normal operation. In addition, ground bouncing is artificially generated through removal of the power pin number, so that operations of the semiconductor device used in an actual package environment can be covered.

Accordingly, when a reference test pattern is input to cause a defect in the semiconductor device, one (1) is deducted from the number of removal power pins Nrm to set the new number of removal power pins Nrm. This is a reappearance of a situation in which the number of power pins connected in a condition determined to be normal is minimum. The final number of power pins is determined by the new number of removal power pins Nrm in which one (1) is deducted from the number of removal power pins Nrm. That is, the final number of power pins represents the number of power pins that are connected to an external power supply among power pins of the semiconductor device. Accordingly, when the number of power pins to be interrupted from the external power supply is deducted from the total number of power pins of the semiconductor device, the number is equal to the final number of power pins.

Referring again to FIG. 1, one (1) is deducted from the number of removal power pins Nrm to determine the final number of power pins, and a delay test pattern is applied to the semiconductor device (S200). That is, the delay test pattern with respect to the semiconductor device connected to electrical power is applied only to the corresponding power pins according to the determined final number of power pins.

Furthermore, the delay test pattern is a test pattern that is applied to the semiconductor device during a scan mode. The delay test pattern may be a scan test pattern that is applied to the scan chain to which scan cells are sequentially connected. The scan test pattern is applied to determine whether the semiconductor device is good or not through the determination on whether the scan cells that are provided during the design of a semiconductor normally operate or not rather than the confirmation of characteristic functions of a function block of the semiconductor device.

Afterwards, whether the semiconductor device is good or not is determined according to the application of the delay test pattern (S210).

When it is determined to be defective according to the application of the delay test pattern, the delay test pattern is increased by cycle increase time Tdw (S220).

The cycle increase time Tdw that is increased per test may be differently set depending on the kind of a semiconductor device to be tested. That is, it may be variously set depending on electrical characteristics including operating speed of the semiconductor device to be tested.

For example, when the operating speed of the semiconductor device is fast, the cycle increase time Tdw is set to be short. In contrast, when the operating speed of the semiconductor device is slow, the cycle increase time Tdw may be set to be long.

Afterwards, the delay test pattern having an increased cycle is applied to the semiconductor device, and whether the semiconductor device is good or not is verified (S230). When it is determined to be defective, the reset cycle of the delay test pattern is increased again, and the increased results are applied to the semiconductor device. The above-described operation is repeated until the semiconductor device is determined to be good.

The increased cycle of the delay test pattern has the following meaning.

The increased cycle of the delay test pattern results in a reduced number of switching operations per unit time of a switching device. When the number of switching operations is reduced, current supplied to the scan cell to which the test pattern is applied is reduced as well. That is, excessive instance current that is required during a delay test may cause a signal in the semiconductor device to be delayed. However, the delay may be offset by increasing the cycle time.

That is, when the application of the delay test pattern causes a higher current to be supplied to the semiconductor device compared with the application of the reference test pattern, the excessive application of the current results in an overkill phenomenon in which a good semiconductor device is determined to be defective due to various factors. The factors of causing the overkill phenomenon by supplying the excessive current include characteristic destruction of a device according to application of excessive current compared with a normal operation, and malfunction of scan cells according to the application of excessive current. In order to reduce the overkill phenomenon, the cycle of a scan pattern is increased, so that additional delay generated by the excessive current is compensated for.

As described above, the optimal condition of the number of removal power pins Nrm is set while the reference test pattern is applied. The reference test pattern represents a test pattern during a normal operation, and a switching operation that is generated by the test pattern is set equivalent or similar to the number of switching operations generated during the normal operation. As a result, it can be verified whether the circuit fulfills its own functions or not.

The number of removal power pins Nrm is increased by one (1) until the semiconductor device is determined to be defective, and the number of power pins connected to electrical power when the device is finally determined to be good is confirmed as the minimum number. This is set as the most severe state when the semiconductor device is in an actual package environment or under the same switching environment in which the semiconductor device performs its own functions. That is, when the number of removal power pins Nrm is increased, the phenomenon including ground bouncing is increased, so that the most severe environment in which a semiconductor device can normally operate is set.

Then, the delay test pattern is applied, and a cycle of the delay test pattern is gradually increased according to whether the semiconductor device is good or bad. The delay test pattern functions to determine the presence of delay time that is generated in the scan cell of the semiconductor device rather than functioning to determine the presence of characteristic functions of a circuit of the semiconductor device as a function test. That is, after applying a test signal with an output of a specific level expected, when the output of the specific level is generated, elapsed time thereof is measured, and it is determined whether the elapsed time complies with the specification of the corresponding semiconductor device.

When a defect occurs, this means that the applied delay test pattern requests more switching operations from the semiconductor device than the reference test pattern. Therefore, the delay test pattern requests greater current consumption than that requested by the reference test pattern through the set Nrm. Accordingly, when the test is performed under the set Nrm without correction of the delay test pattern, the overkill phenomenon in which a good semiconductor device is determined to be defective occurs.

In order to prevent the above phenomenon, when the defect occurs in the semiconductor device in the delay test pattern, a cycle of the pattern is gradually increased, and these operations are repeatedly performed until the semiconductor device is determined to be good. The cycle of the pattern at which the semiconductor device is determined to be good becomes a point at which overkill according to the excessive current caused by the delay test pattern is prevented. Since the increased cycle results in reduced ground bouncing, the semiconductor device is determined to be good at that point.

Afterwards, the set cycle of the delay test pattern is applied so that all of the power pins are recovered to test the subsequent semiconductor device. Also, the set cycle of the delay test pattern is continuously applied to the subsequent same semiconductor device, and the set delay test pattern is applied to the semiconductor devices to follow.

Obviously, when the kind of the semiconductor device is changed, the number of removal power pins Nrm and the delay test pattern are changed as well.

Hardware for accomplishing the above-described testing operations may be implemented using various methods.

For example, as illustrated in FIG. 2, a node connected to a pad in the semiconductor circuit may include an additional controllable switch to control the connection between the pad and the wire.

In addition, the connection may be controlled by a separate test board or test equipment rather than the semiconductor circuit. As a result, switching devices on the test board may be disposed between a power terminal of a semiconductor device and a power supply terminal of the test equipment. Moreover, a power supply that is applied to the semiconductor device through on/off of the switching device may be controlled through a separate control signal. Likewise, the test equipment itself can prevent power from being supplied such that the power supplied to the semiconductor device may be controlled by the test equipment. As a result, the power pin of the semiconductor device may be left floating, and the desired number of removal power pins Nrm may be realized.

While the invention has been shown and described with reference to certain example embodiments thereof, it will be understood by those skilled in the art that various changes in form and details may be made therein without departing from the spirit and scope of the invention as defined by the appended claims.

The invention claimed is:

1. A method of testing the functioning of a semiconductor device, comprising:

applying a reference test pattern to a semiconductor device in which a preset number of power pins are each supplied with a current, setting a number of removal power pins by disconnecting the power pins from the current incrementally, and determining a final number of power pins that indicates a minimum number of power pins with which the semiconductor device is in normal operation; and applying a delay test pattern to the semiconductor device to set a cycle of the delay test pattern corresponding to the final number of power pins.

2. The method of claim 1, wherein the setting of the number of removal power pins comprises:

setting the number of removal power pins to zero, and thereafter applying the reference test pattern to the semiconductor device;

increasing the number of removal power pins by one when the semiconductor device is determined to be in normal operation; and supplying a current to the remaining connected power pins of the semiconductor device, and re-applying the reference test pattern to the semiconductor device.

3. The method of claim 2, wherein the applying of the reference test pattern and the increasing of the number of removal power pins are performed until the semiconductor device is determined to be in abnormal operation.

4. The method of claim 3, wherein the number of removal power pins is reduced by one—when the semiconductor device is determined to be in abnormal operation to thereby determine the final number of power pins.

5. The method of claim 1, wherein the setting of the cycle of the delay test pattern comprises:

supplying a current to each of the final number of power pins of the semiconductor device, and applying the delay test pattern; and increasing the cycle of the delay test pattern when the semiconductor device is in abnormal operation under the application of the delay test pattern.

6. The method of claim 5, wherein the applying of the delay test pattern and the increasing of the cycle of the delay test pattern are performed until the semiconductor device is determined to be in normal operation.

* * * * *